US006841776B1

(12) United States Patent  
Adler

(10) Patent No.: US 6,841,776 B1  
(45) Date of Patent: Jan. 11, 2005

(54) METHOD AND APPARATUS FOR HIGH-SPEED INSPECTION AND REVIEW

(75) Inventor: David L. Adler, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/701,884

(22) Filed: Nov. 5, 2003

Related U.S. Application Data

(60) Provisional application No. 60/459,324, filed on Apr. 1, 2003.

(51) Int. Cl.[7] .......................... H01L 21/00; H01J 37/26
(52) U.S. Cl. ...................... 250/306; 250/307; 250/305; 250/310; 250/492.2; 356/237.1
(58) Field of Search ................................. 250/306, 307, 250/305, 310, 492.2; 356/237.1, 237.2, 237.3

(56) References Cited

U.S. PATENT DOCUMENTS 5,578,821 A    11/1996  Meisberger et al.
6,388,747 B2 *  5/2002  Nara et al. .................. 356/394
6,407,373 B1 *  6/2002  Dotan ....................... 250/201.3
6,610,980 B2 *  8/2003  Veneklasen et al. ......... 250/310

OTHER PUBLICATIONS

Veneklasen, Lee H., "The continuing development of low–energy electron microscopy for characterizing surfaces", Rev. Sci. Instrum, Dec. 1992, pp. 5513–5532, vol. 63, No. 12, American Institute of Physics.

* cited by examiner

Primary Examiner—Nikita Wells
(74) Attorney, Agent, or Firm—Okamoto & Benedicto LLP

(57) ABSTRACT

One embodiment disclosed relates to an apparatus for substrate inspection and review. The apparatus includes at least a first subsystem, a processor, and a second subsystem. The first subsystem is used for inspecting said substrate. The processor is utilized for identifying regions of said substrate for review. The second subsystem is used for reviewing at least a portion of said identified regions.

15 Claims, 4 Drawing Sheets

METHOD AND APPARATUS FOR HIGH-SPEED INSPECTION AND REVIEW

CROSS-REFERENCE TO RELATED APPLICATIONS

The present application claims the benefit of provisional patent application No. 60/459,324, filed Apr. 1, 2003, entitled "Method and Apparatus for High-Speed Inspection and Review", by inventor David L. Adler, the disclosure of which is herby incorporated by reference.

BACKGROUND OF THE INVENTION

1. Field of the Invention

The present invention relates generally to automated inspection methods and apparatus in semiconductor manufacturing and the like.

2. Description of the Background Art

Prior apparatus and methods utilize separate and independent tools for electron beam (e-beam) inspection and review of substrates. Disadvantages of the prior apparatus and methods include the increased cost that results from owning and maintaining two separate tools, and the extra handling required in moving wafers between these separate and independent tools.

The above-described problems and disadvantages may be overcome by utilizing embodiments of the present invention.

SUMMARY

One embodiment of the invention pertains to an apparatus for substrate inspection and review. The apparatus includes at least a first subsystem, a processor, and a second subsystem. The first subsystem is used for inspecting said substrate. The processor is utilized for identifying regions of said substrate for review. The second subsystem is used for reviewing at least a portion of said identified regions.

Another embodiment of the invention relates to a method for inspection and review of a substrate. First, said substrate is inspected in an apparatus to generate inspection data. Second, the inspection data is processed to identify regions of said substrate for review. Third, at least a portion of said regions is reviewed in the apparatus.

DETAILED DESCRIPTION

As described below, the present invention provides a particle beam system with enhanced functionality and improved cost of ownership. A single particle beam system is described having both an inspection mode of operation and a review mode of operation. The tool user is advantageously provided with the opportunity to quickly save and review defect images, without the added effort and expense of utilizing a separate review tool.

In one example, a low-energy electron microscope (LEEM) inspector may be modified by adding a separate review column which obtains high magnification images of some portions of a semiconductor wafer, while other portions are being inspected. The review column could include, for example, multiple detectors and energy-dispersive x-ray (EDX) analysis. Such a system could be used to inspect, for example, eD0 type test structures at high speed, with the inspector used to locate the defect and the review column used for characterization. In a different example, a tool having only one column could be used for both inspection and review. The tool may save images of potential defects for characterization, and could be operated with multiple detectors and/or with EDX capability when those images are being saved.

Figure 1:
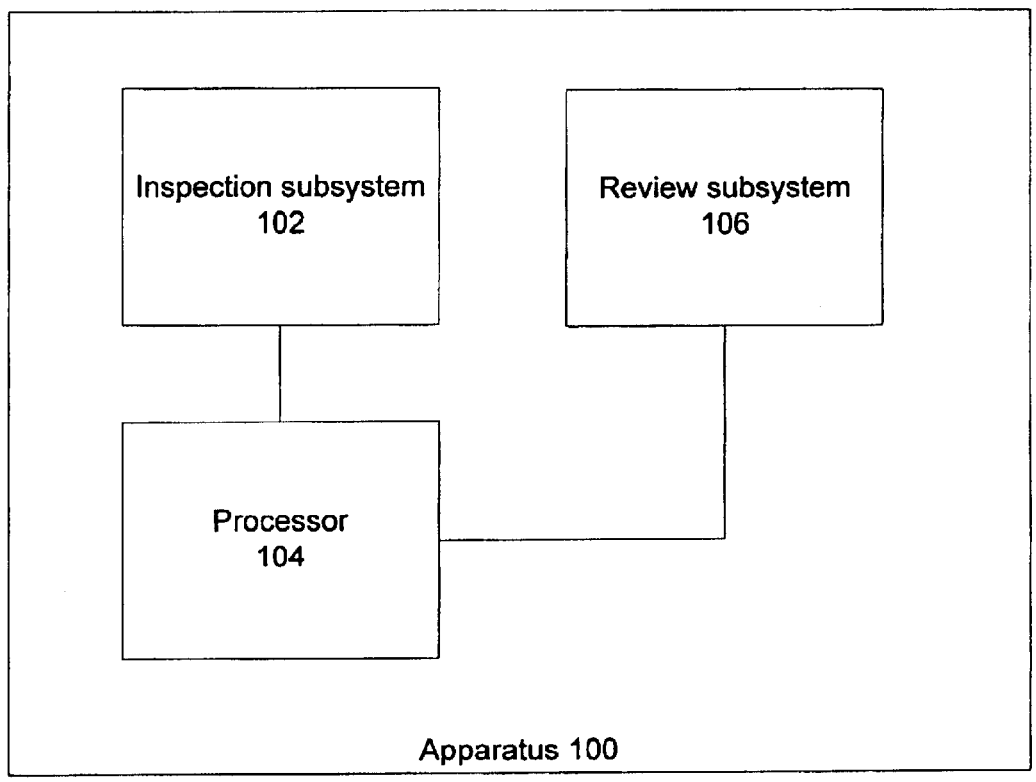
FIG. 1 is a high-level depiction of components of an apparatus for substrate inspection and review in accordance with an embodiment of the invention.

FIG. 1 is a high-level depiction of components of an apparatus for substrate inspection and review in accordance with an embodiment of the invention. The apparatus 30 includes at least an inspection subsystem 32, a processor 34, and a review subsystem 36.

The inspection subsystem 32 is configured to inspect a substrate. The substrate may comprise, for example, a semiconductor wafer being manufactured. In accordance with a preferred embodiment of the invention, the inspection subsystem 32 may perform the inspection while the substrate is on a continuously moving stage.

In accordance with one embodiment, the inspection subsystem 32 may comprise an electron beam microscope adapted for inspection of substrates. For example, such an electron beam microscope may include components configured such as shown or similar to that shown in FIG. 3 and described below. Alternatively, the inspection subsystem 32 may comprise a low-energy electron microscope (LEEM) adapted for inspection of substrates. For example, such a LEEM may include components configured such as shown or similar to that shown in FIG. 4 and described below.

In accordance with one embodiment of the invention, image data obtained by the inspection system may be stored or temporarily stored in data storage. The image data may then be retrieved from the data storage by the processor 34.

The processor 34 is configured to identify regions of said substrate for review. The processor 34 analyzes the image data obtained by the inspection subsystem 32. Various image processing algorithms may be used by the processor 34 to identify the regions for review.

The review subsystem 36 is configured to review at least a portion of said identified regions. The review subsystem 36 is part of the same tool as the inspection subsystem 32. In one embodiment, the review subsystem 36 may perform the review of said identified regions (or portion thereof with the substrate on a stage in a step and settle mode of movement progression. In another embodiment, the review subsystem 36 may perform the review of said identified regions (or portion thereof) with the substrate on a continuously moving stage. In that embodiment, the review image data may be obtained "on the fly" during inspection. If the review images are grabbed on the fly by the inspector, then there is no need to relocate the defect. This saves time and effort.

In accordance with one embodiment, the review subsystem 36 may utilize a separate electron beam (e-beam) column in the apparatus 30 from the e-beam column of the inspection subsystem 32. For example, a separate electron microscope column, such as that depicted in FIG. 3, may be utilized within the apparatus 30 for the review subsystem 36.

For instance, a first electron microscope column may be used for inspection and a second electron microscope column may be used for review. In another example, a separate LEEM column, such as that depicted in FIG. 4, may be utilized within the apparatus 30 for the review subsystem 36. For instance, a first LEEM column may be used for inspection and a second LEEM column may be used for review. In these cases, the configuration and conditions of the electron optical elements in the separate column would be set to obtain detailed image and analytical data in accordance with a review mode. For example, the magnification and/or contrast may be increased in comparison to the inspection mode.

In accordance with another embodiment, the review subsystem 36 may utilize the same electron beam (e-beam) column in the apparatus 30 as the inspection subsystem 32. For example, an electron microscope column, such as that depicted in FIG. 3, may be utilized for both the inspection 32 and review 36 subsystems. In another example, a LEEM column, such as that depicted in FIG. 4, may be utilized for both the inspection 32 and review 36 subsystems. In each of these cases, there would be an inspection mode and a separate review mode for operating the column. In the inspection mode, the configuration and conditions of the electron optical elements in the column would be set to rapidly obtain image data in accordance with substrate inspection. In the review mode, the configuration and conditions of the electron optical elements in the column would be set to obtain detailed image and analytical data to review identified regions (or portions thereof). For example, the magnification and/or contrast may be increased in comparison to the inspection mode.

In accordance with another embodiment, the review subsystem 36 may have one or more shared electron optical elements with the inspection subsystem 32. For example, certain electron optical elements of an electron microscope column, such as that depicted in FIG. 3, may be utilized for both the inspection 32 and review 36 subsystems. In another example, certain electron optical elements of a LEEM column, such as that depicted in FIG. 4, may be utilized for both the inspection 32 and review 36 subsystems. In the review mode, the configuration and conditions of the shared electron optical elements would be set to obtain detailed image and analytical data to review identified regions (or portions thereof). For example, the magnification and/or contrast may be increased in comparison to the inspection mode.

In accordance with one embodiment, the review subsystem 36 may further include multiple detectors to create false or apparent perspective. Alternatively, or in addition, the review subsystem 36 may be configured to provide a variable angle of illumination to create a true perspective.

In accordance with one embodiment, the analytical capabilities of the review subsystem 36 may be enhanced by including one or more of: energy dispersive x-ray (EDX) analysis; electron beam assisted chemical etching (EBACE) capability; a focused ion beam (FIB) column; and/or other analytical capabilities.

In accordance with one embodiment, the apparatus 30 may also include software routines for defect classification, root cause analysis, and the like. These software routines would be applied to analyze image data obtained by the review subsystem 36.

Figure 2:
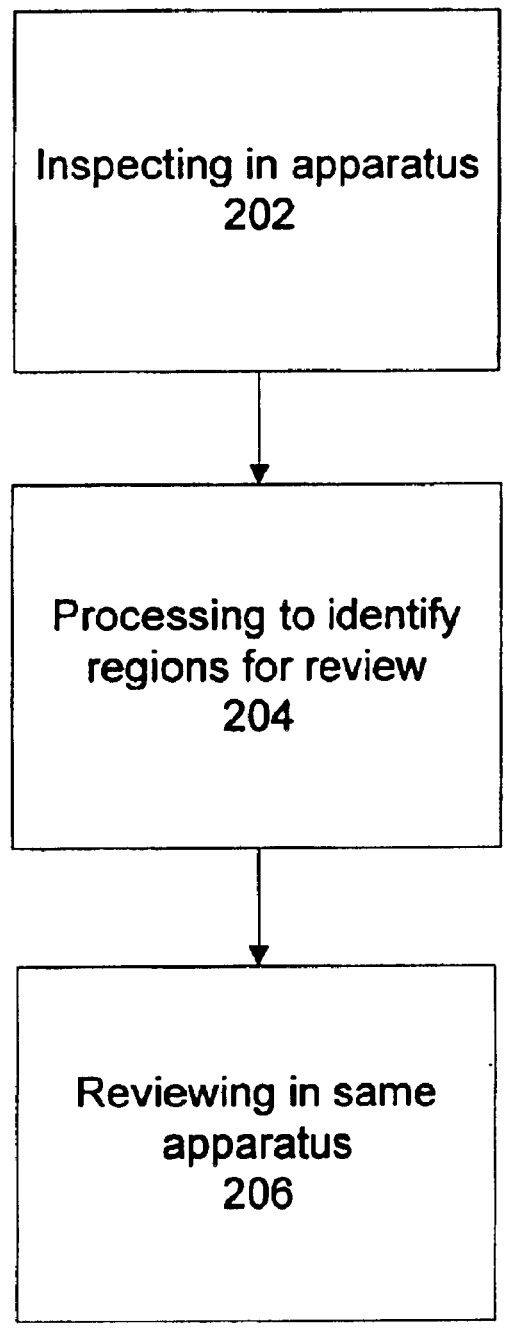
FIG. 2 is a high-level flow chart of a method for substrate inspection and review in accordance with an embodiment of the invention.

FIG. 2 is a high-level flow chart of a method for substrate inspection and review in accordance with an embodiment of the invention. First, said substrate is inspected 42 in an apparatus to generate inspection data. Second, the inspection data is processed 44 to identify regions of said substrate for review. Third, at least a portion of said regions is reviewed 46 in the apparatus.

In accordance with one embodiment, the method may also include subsequent steps involving defect classification, root cause analysis, and the like. In such steps, image data obtained by the review subsystem 36 would be further analyzed.

Figure 3:
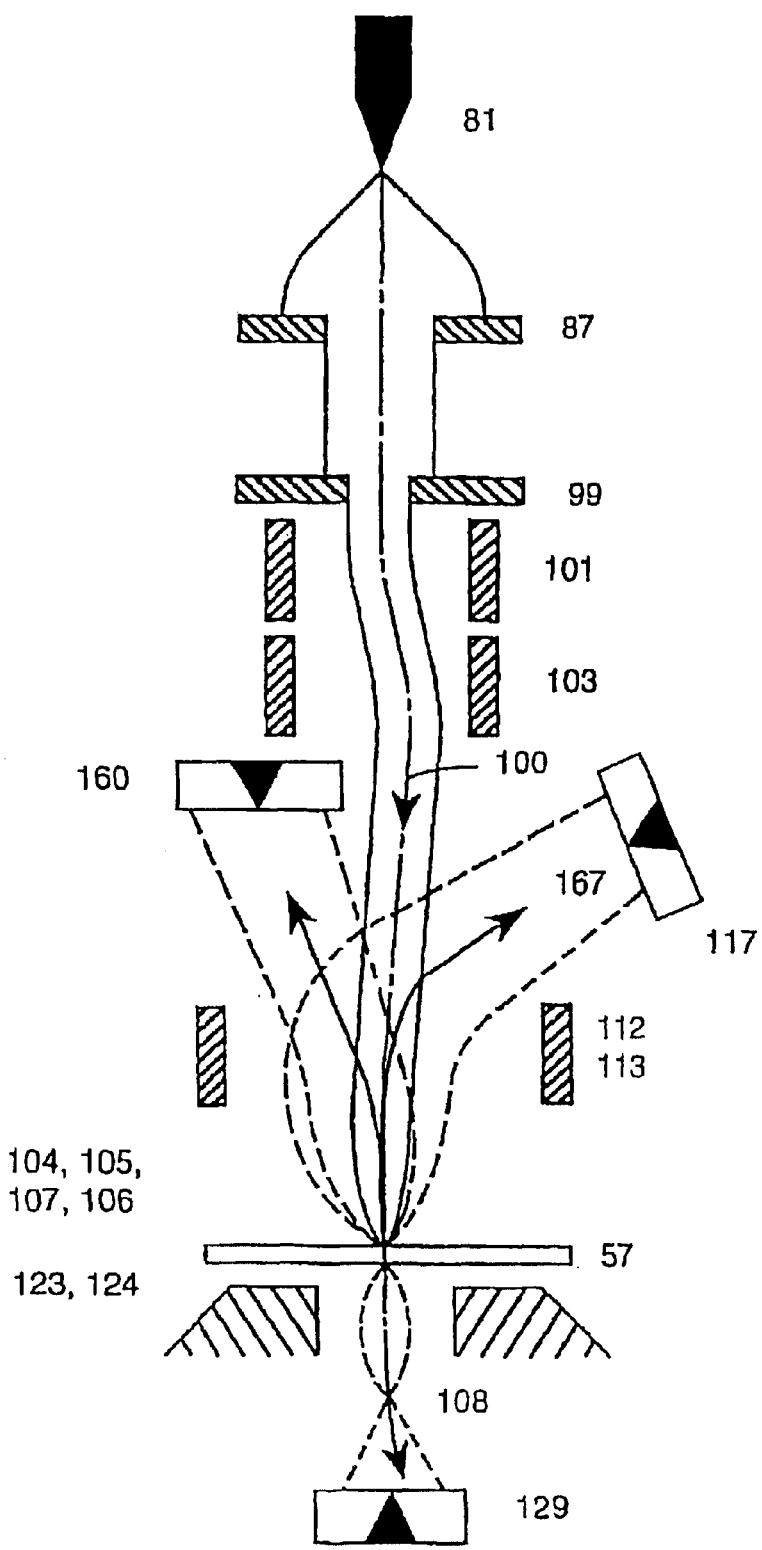
FIG. 3 is a schematic diagram of an electron microscope column in accordance with an embodiment of the invention.

FIG. 3 is a schematic diagram of an electron microscope column in accordance with an embodiment of the invention. The electron microscope inspection subsystem depicted in FIG. 3 is a simplified schematic representation of the paths of the primary, secondary, back-scatter and transmitted electrons through the electron optical column and collection subsystem for electron beam inspection. In brief, FIG. 3 shows a schematic diagram of the various electron beam paths within the column and below substrate 57. Electrons are emitted radially from field emission cathode 81 and appear to originate from a very small bright point source. Under the combined action of the accelerating field and condenser lens magnetic field, the beam is collimated into a parallel beam. Gun anode aperture 87 masks off electrons emitted at unusable angles, while the remaining beam continues on to beam limiting aperture 99. An upper deflector (not depicted) is used for stigmation and alignment, ensuring that the final beam is round and that it passes through the center of the objective lens 104 comprising elements 105, 106 and 107. A condenser lens (not depicted) is mechanically centered to the axis defined by cathode 81 and beam limiting aperture 99. The deflection follows the path shown, so that the scanned, focused probe (beam at point of impact with the substrate) emerges from the objective lens 104. In High Voltage mode operation, Wien filter deflectors 112 and 113 deflect the secondary electron beam 167 into detector 117. When partially transparent masks are imaged, the transmitted beam 108 passes through electrode system 123 and 124 that spreads the beam 108 before it hits the detector 129. In Low Voltage mode operation, the secondary electron beam is directed by stronger Wien filter deflections toward the low voltage secondary electron detector 160 that may be the same detector used for backscatter imaging at high voltage.

Figure 4:
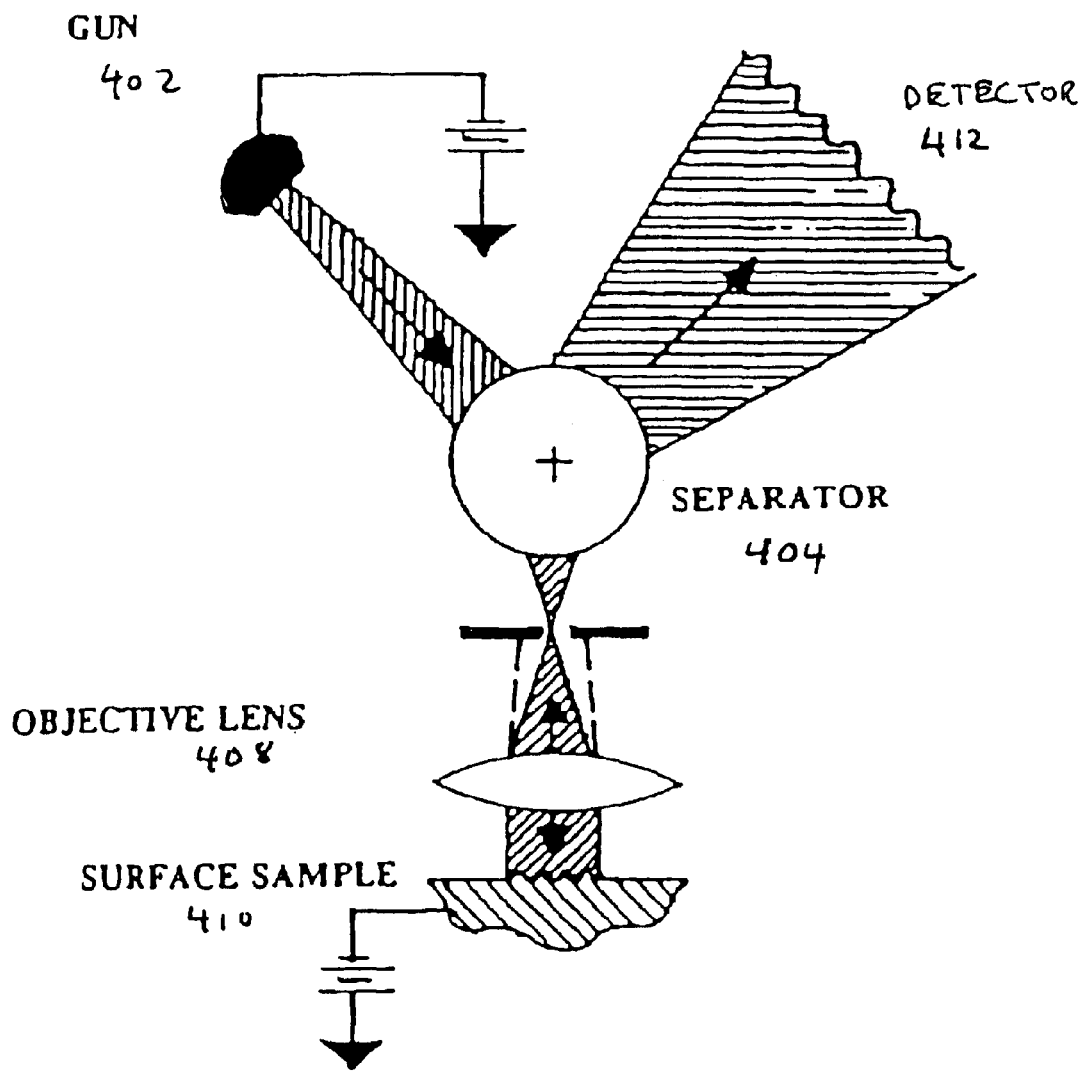
FIG. 4 is a simplified diagram of a low-energy electron microscope (LEEM) column in accordance with an embodiment of the invention.

FIG. 4 is a simplified diagram of a low-energy electron microscope (LEEM) column in accordance with an embodiment of the invention. The elements depicted include an electron gun 402, a beam separator 404, an objective lens 408, a surface of a sample substrate 410, and a detector or screen 412.

The electron gun 402 supplies electrons that illuminate the sample or regions thereof. Absorption, scattering, and interference of electrons at the sample allow observation of detail much smaller than a light optical microscope can resolve. A characteristic feature of the LEEM is the beam separator 404. This element allows the electron illumination and image beams to fold back upon themselves after reflecting from the surface 410 of the substrate. The objective lens 408 acts upon incoming illumination and outgoing image beams in very similar ways, but above the objective lens 408, a magnetic prism or other beam separator 404 deflects the beams in opposite directions, creating separate spaces or the illumination and imaging electron optics. The detector 412 receives the electrons for imaging and generates image data therefrom.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for inspection and review of a substrate, the apparatus comprising:
    a first subsystem for inspecting said substrate;
    a processor for identifying regions of said substrate for review; and
    a second subsystem for reviewing at least a portion of said regions,
    wherein both said first and second subsystems each comprises an electron beam microscope,
    wherein the inspection of the substrate is performed while the substrate is on a continuously moving stage, and
    wherein review images from said regions are grabbed "on the fly" by the apparatus so as to avoid a need to relocate said regions.

2. The apparatus of claim 1, wherein said first subsystem and said second subsystem share one or more electron optical elements in common.

3. The apparatus of claim 2, wherein said first subsystem and said second subsystem share substantially all electron optical elements in common.

4. The apparatus of claim 1, wherein said portion is reviewed at a second condition differing from a first condition under which said portion is inspected.

5. The apparatus of claim 1, wherein said portion is reviewed at a second condition differing from a first condition under which said portion is inspected.

6. The apparatus of claim 5, wherein said first condition and said second condition differ from one another with regard to at least one parameter selected from the group including: true perspective; apparent perspective; magnification; and contrast.

7. The apparatus of claim 1, wherein said first subsystem comprises a LEEM.

8. The apparatus of claim 1, wherein said second subsystem comprises a LEEM.

9. The apparatus of claim 1, wherein both said first and second subsystems each comprises a LEEM.

10. The apparatus of claim 9, wherein said first subsystem and said second subsystem share one or more electron optical elements in common.

11. The apparatus of claim 10, wherein said first subsystem and said second subsystem share substantially all electron optical elements in common.

12. The apparatus of claim 9, wherein said portion is reviewed at a second condition differing from a first condition under which said portion is inspected.

13. The apparatus of claim 12, wherein said first condition and said second condition differ from one another with regard to at least one parameter selected from the group including: true perspective; apparent perspective; magnification; and contrast.

14. A method for inspection and review of a substrate, the method comprising:
    inspecting said substrate in an apparatus to generate inspection data;
    processing the inspection data to identify regions of said substrate for review; and
    reviewing at least a portion of said regions in the apparatus,
    wherein the inspecting is performed using a first subsystem of the apparatus,
    wherein the reviewing is performed using a second subsystem of the apparatus,
    wherein said portion is reviewed at a second condition differing from a first condition under which said portion is inspected,
    wherein the inspection of the substrate is performed while the substrate is on a continuously moving stage, and
    wherein review images from said regions are grabbed "on the fly" by the apparatus so as to avoid a need to relocate said regions.

15. The method of claim 14, wherein said first condition and said second condition differ from one another with regard to at least one parameter selected from the group including: true perspective; apparent perspective; magnification; and contrast.

* * * * *

UNITED STATES PATENT AND TRADEMARK OFFICE
CERTIFICATE OF CORRECTION

PATENT NO. : 6,841,776 B1 Page 1 of 1
APPLICATION NO. : 10/701884
DATED : January 11, 2005
INVENTOR(S) : Adler It is certified that error appears in the above-identified patent and that said Letters Patent is hereby corrected as shown below:

<u>Drawings,</u>
FIG. 1, after "Inspection subsystem", replace "102" with -- 32 --.
FIG. 1, after "Review subsystem", replace "106" with -- 36 --.
FIG. 1, after "Processor", replace "104" with -- 34 --.
FIG. 1, after "Apparatus", replace "100" with -- 30 --.
FIG. 2, after "Inspecting in apparatus", replace "202" with -- 42 --.
FIG. 2, after "Processing to identify regions for review", replace "204" with -- 44 --.
FIG. 2, after "Reviewing in same apparatus", replace "206" with -- 46 --.

Signed and Sealed this

Twenty-seventh Day of June, 2006

JON W. DUDAS
*Director of the United States Patent and Trademark Office*